United States Patent [19]
Gröninger et al.

[11] Patent Number: 6,146,698
[45] Date of Patent: Nov. 14, 2000

[54] PROCESS FOR SIMULTANEOUSLY WETTING A PLURALITY OF ELECTRICAL CONTACT AREAS WITH A LIQUID

[75] Inventors: Horst Gröninger, Maxhütte-Haidhof; Rudolf Kerler, Lappersdorf, both of Germany

[73] Assignee: Infineon Technologies AG, Munich, Germany

[21] Appl. No.: 09/106,234

[22] Filed: Jun. 29, 1998

[30] Foreign Application Priority Data

Jun. 27, 1997 [DE] Germany ............. 197 27 462
Jul. 29, 1997 [DE] Germany ............. 197 32 680

[51] Int. Cl.$^7$ ............. B05C 1/02; H01L 21/60; H01L 23/50
[52] U.S. Cl. ............. 427/282; 156/291; 156/578; 228/33; 228/36; 118/200
[58] Field of Search ............. 156/291, 578; 118/200, 263; 427/256, 282, 445; 29/739, 741; 228/33, 35, 36, 39

[56] References Cited

U.S. PATENT DOCUMENTS

| | | |
|---|---|---|
| 5,482,736 | 1/1996 | Glenn et al. ............. 228/35 X |
| 5,676,305 | 10/1997 | Potter et al. . |
| 5,686,226 | 11/1997 | Groman et al. ............. 228/35 X |
| 5,834,062 | 11/1998 | Johnson et al. ............. 228/33 X |
| 5,899,376 | 5/1999 | Tatumi et al. ............. 228/36 X |

FOREIGN PATENT DOCUMENTS

3345596C2  1/1987  Germany .

*Primary Examiner*—Curtis Mayes
*Attorney, Agent, or Firm*—Herbert L. Lerner; Laurence A. Greenberg; Werner H. Stemer

[57] ABSTRACT

An apparatus for simultaneously wetting a plurality of electrical contact areas with a liquid includes a punch with nubs or studs made of an elastomer. The number, configuration and dimensions of the nubs are adapted to the contact areas to be wetted. A process for simultaneously wetting a plurality of electrical contact areas with a liquid includes wetting the nubs with the liquid, leading the punch over the contact areas in such a way that the nubs are each disposed over one of the contact areas, and subsequently transferring the liquid from the nubs onto the contact areas.

5 Claims, 2 Drawing Sheets

PROCESS FOR SIMULTANEOUSLY WETTING A PLURALITY OF ELECTRICAL CONTACT AREAS WITH A LIQUID

BACKGROUND OF THE INVENTION

1. Field of the Invention

The invention relates to an apparatus and a process for simultaneously wetting a plurality of electrical contact areas with a liquid.

2. Summary of the Invention

It is accordingly an object of the invention to provide an apparatus and a process for simultaneously wetting a plurality of electrical contact areas with a liquid, which overcomes the disadvantages of the heretofore-known apparatuses and methods of this general type.

With the foregoing and other objects in view there is provided, in accordance with the invention, an apparatus for simultaneously wetting a plurality of electrical contact areas with a liquid, comprising a punch with nubs or studs formed of an elastomer, the nubs or studs being adapted in number, configuration and dimensions to electrical contact areas to be wetted with a liquid. An elastomer has flexible elastic properties and may be either natural rubber or a plastic.

With the objects of the invention in view, there is also provided a process for simultaneously wetting a plurality of contact areas with a liquid, which comprises wetting elastomer nubs or studs of a punch with a liquid; guiding the punch over contact areas until each of the nubs or studs is located over a respective one of the contact areas; and transferring the liquid from the nubs or studs onto the contact areas.

Since the nubs or studs are formed of an elastomer, they are extremely flexible and consequently, as tests have shown, particularly well suited for the wetting to be carried out. The flexibility is advantageous in particular because it makes it possible to compensate for production tolerances in the production of the nubs and the contact areas.

In accordance with another feature of the invention, the punch and the nubs are formed in one piece. Such a punch which is made of an elastomer and has nubs is particularly simple and consequently inexpensive to produce. In order to do so, use may be made, for example, of a masking technique in which masks are used for the partial phototechnical exposure of the elastomer, in a manner similar to the production process of semiconductor technology. In such a process, depending on the method chosen, exposed or non-exposed portions of the elastomer are partially removed by using a solvent and corresponding covering layers, for example of a lacquer. In addition, an elastomer is an inexpensive material.

Furthermore, the one-piece form of the punch and the nubs has the advantage of achieving even better flexibility of the components of the wetting apparatus which serve for wetting.

In accordance with a further feature of the invention, the flexibility can be improved even further by placing a flexible underlay, preferably a cellular rubber, on the side of the punch facing away from the nubs. A cellular rubber is an elastomer which has air inclusions and consequently increased elasticity. The high flexibility or elasticity of the wetting apparatus advantageously makes it possible to compensate for unevennesses of the contact areas to be wetted or of a substrate on which the latter are disposed.

In accordance with an added feature of the invention, the invention is suitable in particular for wetting if the liquid to be transferred is a flux. Fluxes serve for removing oxides on the surface of the contact areas and, if appropriate, as an adhesive layer for a solder, which may subsequently be applied to the contact areas in order to permit soldering of the contact areas to other electrical components or contacts. An elastomer is particularly well suited as the material for the nubs for transferring a flux onto the contact areas since the flux on one hand easily remains adhering to the nubs and on the other hand also comes away well from the latter when it is brought into contact with the material of the contact areas.

In accordance with an additional feature of the invention, the contact areas are disposed on a ball-grid-array package. The invention has the further advantage that the punch with the nubs can be produced through the use of the described photographic technique even with nubs which have very small dimensions and spacings between them, in particular if the punch and nubs are formed in one piece. Consequently, the invention is particularly well suited for use when wetting contact areas which are spaced very closely with respect to one another and also have small dimensions. This is the case, for example, with the so-called ball-grid-array packages. With such packages, one main surface of the package has a matrix of contact areas, which are often very numerous. A wetting of all of the contact areas with a flux can be advantageously carried out simultaneously with the apparatus according to the invention before the contact areas are provided with small soldering balls which are typical of the ball-grid-array and adhere to the contact areas due to the applied flux.

In accordance with an additional feature of the invention, the contact areas are disposed on a chip-size package. Since the invention makes it possible to produce an inexpensive wetting apparatus which is also suitable for extremely small dimensions and spacings of the contact areas, it is also suitable, for example, for use with the so-called chip-size packages. In that case, the package of an integrated circuit is only marginally larger than the integrated circuit itself. However, the use of the invention is not restricted just to these cases of minimal contact areas. Rather, it may also be considered to use it for the wetting of contact areas which are not component parts of an integrated circuit or its package but are disposed, for example, on printed circuit boards or other substrates.

In accordance with another mode of the invention, the wetting of the nubs with the liquid takes place by firstly producing a thin layer of the liquid, for which purpose the use of a doctor blade is suitable in particular, and subsequently dipping the tips of the nubs into this liquid layer for wetting. This procedure permits a uniform wetting of the nubs.

In accordance with a further mode of the invention, the thickness of the liquid layer is only 0.2 to 0.3 mm. This favors uniform wetting of the nubs with only a very small amount of liquid in each case.

In accordance with an added feature of the invention, the diameter of each nub corresponds approximately to 50 to 60% of the diameter of the respective contact area to be wetted. Tests have shown that, as a result, particularly good wetting of the contact areas takes place if, for instance, the nubs are set down centrally on the contact areas.

In accordance with an additional mode of the invention, there is provided a process which comprises inserting a perforated stencil into a receptacle for a component having the contact areas, the stencil having the same outer dimensions as the component and having perforations with a configuration corresponding to a configuration of the contact areas on the component; inserting the punch with the nubs into the perforations of the stencil; placing a mount to be moved in a defined way relative to the receptacle, onto a side of the punch facing away from the nubs and mechanically bonding the mount to the punch; removing the mount with the punch from the stencil and removing the stencil from the receptacle; and inserting the component into the receptacle.

In accordance with a concomitant mode of the invention, there is provided a process which comprises carrying out the step of mechanically bonding the mount to the punch with a double-sided adhesive film.

Other features which are considered as characteristic for the invention are set forth in the appended claims.

Although the invention is illustrated and described herein as embodied in an apparatus and a process for simultaneously wetting a plurality of electrical contact areas with a liquid, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying figures.

DESCRIPTION OF THE PREFERRED EMBODIMENTS

Figure 1:
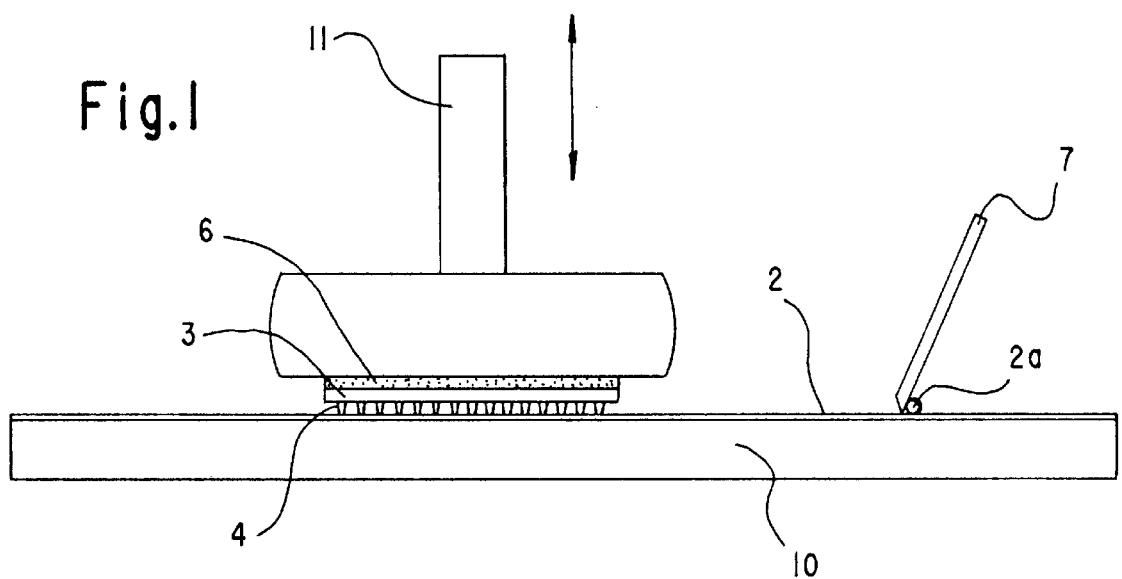
FIG. 1 is a diagrammatic, elevational view illustrating wetting with a flux according to an exemplary embodiment of a wetting apparatus.

Referring now to the figures of the drawings in detail and first, particularly, to FIG. 1 thereof, there is seen an underlying surface 10 on which a thin layer of a flux 2 is produced in a uniform thickness through the use of a doctor blade 7 that is moved over the underlying surface 10. The production of the flux layer is indicated by a drop 2a of the flux 2. The drop is produced when the doctor blade 7 is drawn over the underlying surface 10.

An exemplary embodiment of a wetting apparatus according to the invention is shown above the flux layer 2 in FIG. 1. The wetting apparatus has a T-shaped mount 11, which preferably is formed of metal and is therefore inflexible. A cellular rubber 6 is disposed in a sheet-like manner on an underside of the mount 11 as a flexible intermediate layer. A punch 3 with nubs or studs 4 is secured on an underside of the cellular rubber 6, is produced in one piece and is formed of an elastomer. Such a punch 3 can be produced very simply and inexpensively by a masking technique.

A vertical arrow in FIG. 1 indicates that the wetting apparatus is brought into contact with the flux layer 2 from above for the purpose of wetting the nubs 4. In this case, it is sufficient if only the tips of the nubs 4 come into contact with the flux 2. The flux 2 remains on the nubs 4 by adhesion. In the case of this preferred exemplary embodiment, the layer 2 is about 0.2 to 0.3 mm thick.

Figure 2:
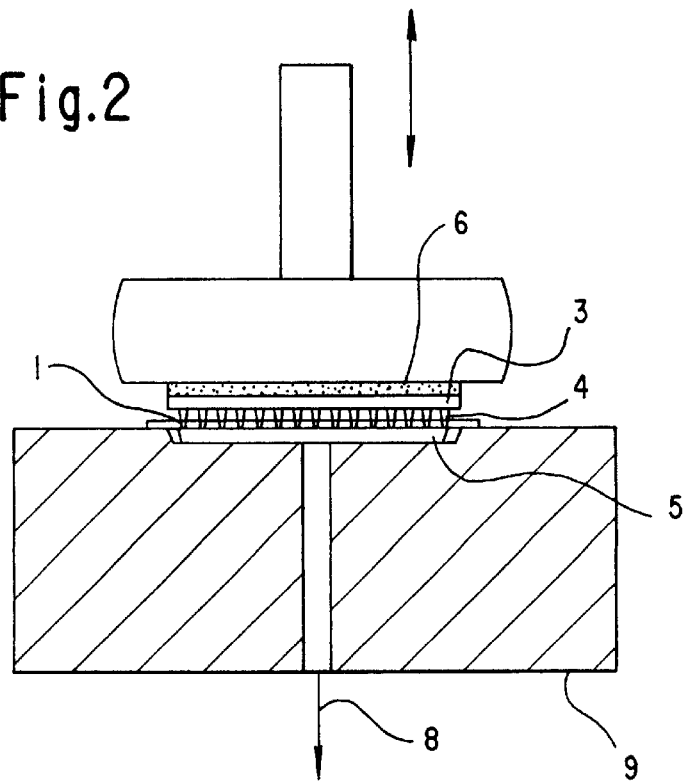
FIG. 2 is a partly sectional view illustrating subsequent wetting of contact areas through the use of the wetting apparatus of FIG. 1.

FIG. 2 shows a ball-grid-array (BGA) package 5 with contact areas 1. The BGA package is fixed on a tool 9 through the use of negative pressure (represented by an arrow 8). According to a vertical double-headed arrow depicted in FIG. 2, the wetting apparatus is set down with the nubs 4 being wetted according to FIG. 1. The wetting apparatus is set down from above on the contact area 1, so that an at least partial transfer of the flux 2 at the tips of the nubs 4 onto the respective contact area 1 takes place.

In this case, the nubs 4 of the punch 3 are constructed in such a way that each of them is respectively disposed over one of the contact areas 1 of the BGA package 5 during the wetting operation represented in FIG. 2. The tips of the nubs 4 have a diameter which corresponds to about 50 to 60% of the diameter of the respective contact area 1. In FIG. 2, the nubs or knobs 4 are respectively disposed approximately centrally over the contact areas 1.

Figure 3:
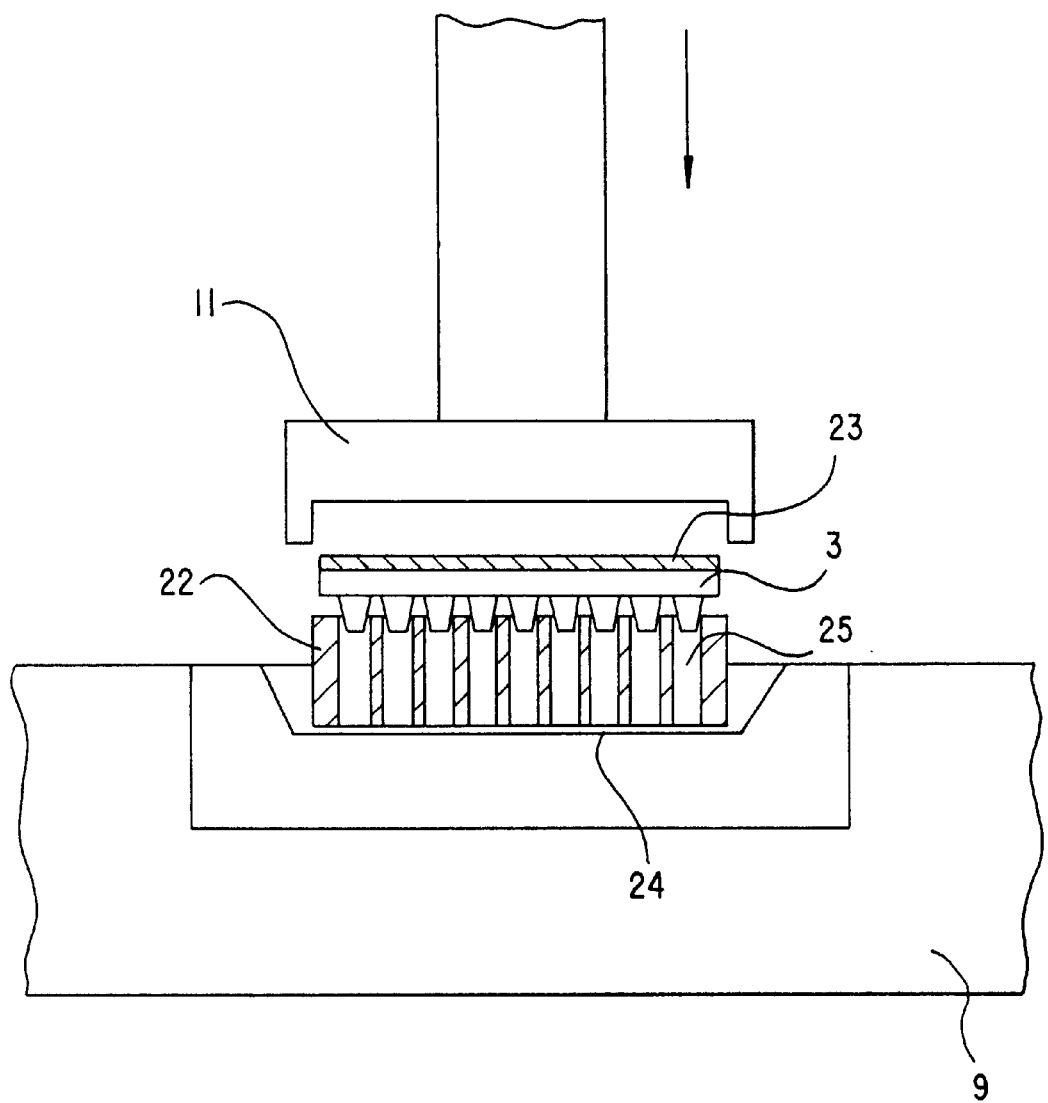
FIG. 3 is a fragmentary, elevational view illustrating an adjustment of a punch of the wetting apparatus of FIG. 1.

FIG. 3 shows an advantageous possibility for adjusting the punch 3 of the wetting apparatus to carry out the wetting. The tool 9 with a receptacle 24 for the BGA package 5 of FIG. 2 is represented again in the figure. Firstly, instead of the BGA package 5, a perforated stencil, pattern or template 22 which has the same outer dimensions as the package 5 is placed into the receptacle 24. The stencil 22 has perforations 25 in a configuration corresponding to the configuration of the contact area 1 of the package 5. The punch 3 is then inserted with its nubs 4 into the perforations 25 of the stencil 22.

This is favored by the conical shape of the nubs 4 for self-adjustment. The mount 11 is moveable in a defined manner with respect to the tool 9 and consequently with respect to the receptacle 24, since it is a component part of the tool 9. The mount is pressed from above (as indicated by an arrow in FIG. 3) onto the punch 3, with a double-sided adhesive film 23 ensuring a mechanical bond between the mount and the punch. Finally, the mount 11 with the punch 3 secured to it is removed from the stencil 22 and the latter is taken out of the receptacle 24.

Then the package 5 is inserted into the receptacle 24, as shown in FIG. 2. The punch 3 is wetted according to FIG. 1 and the wetting of the contact areas 1 of the package 5 is subsequently carried out according to FIG. 2.

The process described with reference to FIG. 3 ensures that during securing on the mount 11, the punch 3 is adjusted with respect to the perforations 25 of the stencil 22, the position of which coincides exactly with the position of the contact areas 1 to be wetted.

The receptacle 24 of the tool 9 and the punch 3 have interchangeable structures, so that different forms of packages or forms of components can be wetted with the same tool.

We claim:

1. A process for simultaneously wetting a plurality of contact areas with a liquid, which comprises:
   inserting a perforated stencil into a receptacle for a component having contact areas, the stencil having the same outer dimensions as the component and having perforations with a configuration corresponding to a configuration of the contact areas on the component;

inserting a punch with elastomer nubs into the perforations of the stencil;

placing a mount to be moved in a defined way relative to the receptacle, onto a side of the punch facing away from the nubs and mechanically bonding the mount to the punch;

removing the mount with the punch from the stencil and removing the stencil from the receptacle;

inserting the component into the receptacle;

subsequently, wetting the elastomer nubs of the punch with a liquid;

guiding the punch over the contact areas until each of the nubs is located over a respective one of the contact areas; and transferring the liquid from the nubs onto the contact areas.

2. The process according to claim 1, which comprises producing a thin layer of the liquid, and dipping tips of the nubs into the thin layer of the liquid for wetting.

3. The process according to claim 2, which comprises producing the layer of the liquid with a doctor blade.

4. The process according to claim 2, which comprises producing the layer of the liquid in a thickness of about 0.2 to 0.3 mm.

5. The process according to claim 1, which comprises carrying out the step of mechanically bonding the mount to the punch with a double-sided adhesive film.

* * * * *